US006580833B2

(12) United States Patent
Goertzen

(10) Patent No.: US 6,580,833 B2
(45) Date of Patent: *Jun. 17, 2003

(54) APPARATUS AND METHOD FOR ENTROPY CODING

(75) Inventor: Kenbe D. Goertzen, Topeka, KS (US)

(73) Assignee: QuVis, Inc., Topeka, KS (US)

(*) Notice: Subject to any disclaimer, the term of this patent is extended or adjusted under 35 U.S.C. 154(b) by 0 days.

This patent is subject to a terminal disclaimer.

(21) Appl. No.: 09/933,457

(22) Filed: Aug. 20, 2001

(65) Prior Publication Data
US 2002/0034334 A1 Mar. 21, 2002

Related U.S. Application Data

(63) Continuation of application No. 09/112,668, filed on Jul. 9, 1998, now Pat. No. 6,298,160.
(60) Provisional application No. 60/052,144, filed on Jul. 9, 1997.

(51) Int. Cl.[7] .............................. G06K 9/36; G06K 9/46; H03M 7/00
(52) U.S. Cl. ...................... 382/244; 382/232; 382/247; 341/50
(58) Field of Search ................ 382/232, 233–236, 382/238–240, 244–249, 251–253; 341/107, 51, 65

(56) References Cited

U.S. PATENT DOCUMENTS

| 4,363,036 A | * | 12/1982 | Subramaniam | 382/238 |
| 5,023,611 A | * | 6/1991 | Chamzas et al. | 341/107 |
| 5,025,258 A | * | 6/1991 | Duttweiler | 341/107 |
| 5,298,896 A | * | 3/1994 | Lei et al. | 341/107 |
| 5,315,670 A | * | 5/1994 | Shapiro | 382/233 |
| 5,357,250 A | * | 10/1994 | Healey et al. | 341/107 |
| 5,448,642 A | * | 9/1995 | Yeh | 382/232 |
| 5,546,080 A | * | 8/1996 | Langdon et al. | 341/107 |
| 5,748,121 A | * | 5/1998 | Romriell | 341/65 |
| 5,778,102 A | * | 7/1998 | Sandford et al. | 382/239 |
| 6,298,160 B1 | * | 10/2001 | Goertzen | 382/232 |

FOREIGN PATENT DOCUMENTS

| EP | 0 600 646 A2 | 6/1994 |
| EP | 0 600 646 B1 | 9/2000 |
| WO | WO 96/19045 | 6/1996 |

OTHER PUBLICATIONS

Barbir, A. "A Methodology for Performing Secure Data Compression." pp. 266–270, IEEE 1997.
EPO International Search Report, dated Jul. 8, 1999, received Jul. 13, 1999.

* cited by examiner

Primary Examiner—Andrew W. Johns
Assistant Examiner—Duy M. Dang
(74) Attorney, Agent, or Firm—Bromberg & Sunstein LLP

(57) ABSTRACT

A quantified symbol stream is sampled, using the quantified symbols prior to the current symbol, to generate a modeling value that characterizes the stream. The modeling value is used to generate, or retrieve, a probability function that provides the probability that the current symbol will be the next symbol in the symbol stream. The probability given by the probability function is then used to select the used to represent the data. The encoded symbol is later decoded using the characteristics of the code, and an identical probability function, to determine the value of the original quantified symbol.

17 Claims, 6 Drawing Sheets

| WEIGHTED SUM | MODELING VALUE | P[0] | ZCNT |
|---|---|---|---|
| 768 | 10 | 1/1535 | 1 |
| 384 | 9 | 1/767 | 1 |
| 192 | 8 | 1/383 | 1 |
| 96 | 7 | 1/191 | 1 |
| 48 | 6 | 1/95 | 1 |
| 24 | 5 | 1/47 | 1 |
| 12 | 4 | 1/23 | 1 |
| 6 | 3 | 1/11 | 1 |
| 3 | 2 | 1/5 | 1 |
| 4/3 | 1 | 1/3 | 1 |
| 3/4 | 0 | $(1/2)^{\wedge}1$ | 1 |
| 1/3 | -1 | $(1/2)^{\wedge}(1/2)$ | 2 |
| 1/6 | -2 | $(1/2)^{\wedge}(1/4)$ | 4 |
| 1/12 | -3 | $(1/2)^{\wedge}(1/8)$ | 8 |
| 1/24 | -4 | $(1/2)^{\wedge}(1/16)$ | 16 |
| 1/48 | -5 | $(1/2)^{\wedge}(1/32)$ | 32 |
| 1/96 | -6 | $(1/2)^{\wedge}(1/64)$ | 64 |
| 1/192 | -7 | $(1/2)^{\wedge}(1/128)$ | 128 |
| 1/384 | -8 | $(1/2)^{\wedge}(1/256)$ | 256 |
| 1/768 | -9 | $(1/2)^{\wedge}(1/512)$ | 512 |
| 1/1536 | -10 | $(1/2)^{\wedge}(1/1024)$ | 1024 |
| 1/3072 | -11 | $(1/2)^{\wedge}(1/2048)$ | 2048 |
| 1/6144 | -12 | $(1/2)^{\wedge}(1/4096)$ | 4096 |

FIG. 6

APPARATUS AND METHOD FOR ENTROPY CODING

CROSS-REFERENCE TO RELATED APPLICATIONS

This invention is a continuation of our prior application Ser. No. 09/112,668, filed Jul. 9, 1998 now U.S. Pat. No. 6,298,160; which claimed the benefit of provisional application Ser. No. 60/052,144, filed Jul. 9, 1997; the disclosures of both of these related applications are hereby incorporated herein by reference.

FIELD OF THE INVENTION

The present invention relates to the processing of signals, and more particularly to an apparatus and method for entropy coding in the processing of signals.

BACKGROUND OF THE INVENTION

One shortcoming of conventional processing of electronic signals concerns the techniques that are used to reduce the amount of data that is used to represent the signal. One way that the amount of data required to represent a signal is reduced is by using data compression techniques.

Entropy coding is one technique for reducing the amount of data that is used to represent signals. Entropy coding changes the way that the actual values are stored, or redefines them, to reduce the amount of information that is used to represent a signal. A simple type of coding used in image coding, for example, uses a difference value instead of an actual value to represent pixels. Specifically, difference coding maintains the difference between each pixel and the previous pixel in an image. This coding type offers better compression when images are highly correlated because the pixel differences are low. However, difference coding is deficient in its failure to adequately compress the many images, or other types of data signals, that are not highly correlated.

Many conventional processors implement fixed probabilities to represent the symbol stream. One type of fixed probability coding is variable length coding, where values are coded based upon their expected frequency of occurrence. Specifically, if a certain value is expected to occur frequently within the images to be processed, then a short code (e.g., 1) is used to represent that value. However, if another value is expected to occur infrequently, then it is represented by a long code (e.g., 000001). Fixed probability coding, such as Huffman type, offers compression for signals with expected value distributions, but is not as effective when values vary greatly, which is often the case because data can make rapid and extreme localized changes in probability distributions.

An improvement to this form of signal processing implements a coding system, called historical coding, that encodes the signal using statistics collected on recent symbols in the signal. One implementation of this system involves using a table to keep a tally of the symbols in the signal. The tally kept for each symbol determines how the symbol will be encoded. These historical coding systems suffer from several problems. First, processing overhead is a function of the resolution of the data to be processed. Relatively large symbol sets require greater computational overhead. Additionally, as symbol sets are enlarged to increase signal resolution, larger neighborhoods of data are required to collect meaningful statistics. Thus, with large symbol sets, if the local probability is changing rapidly a large sample size can actually counter prompt and accurate determination of local probability. As the symbol set becomes large, it becomes progressively less likely that a specific symbol will be repeated in a local neighborhood.

Efforts to solve the problems of coding based upon data distribution collection have lead to complex systems which are difficult to implement in hardware, do not readily allow for either fast execution or reasonable cost, and provide low frequency approximations of local probability. These coding methods are also unable to implement effective encryption protection for the coded stream being transmitted. Combining entropy coding with encryption improves both the security and efficiency of communication.

Accordingly, there remains a need for signal processing that implements an entropy coding scheme that more efficiently reduces data quantities and does so in a real time environment. Additionally, there remains a need to effectively implement encryption technology during signal processing such that unauthorized receipt or use of the symbol stream can be prevented.

SUMMARY OF THE INVENTION

The present invention is a system and method for encoding symbols in a symbol stream to compress the amount of data required to represent a signal corresponding to the symbol stream. When coding a current symbol, a modeling value is calculated by a modeling module as a function of a sampling of symbols local to a current symbol. The classification module uses the modeling value to create, or retrieve, a probability function that corresponding to the stream. The probability function is used to calculate the probability that the current symbol would have been the next symbol in the stream. The encoding of the current symbol depends upon the probability that the current symbol would have been the next symbol in the stream. An encoder uses more or less bits to encode the symbol based on the probability provided.

The system and method can further be used to decode the symbols using the same process for determining a modeling value and mapping the modeling value to a probability function as was performed by the encoder. The characteristics of the bits in the encoded symbol are used by the decoder to determine the probability assessed by the encoder. The probability function retrieved by the decoder is used in a reverse lookup in order to determine the original symbol value that was encoded. Furthermore, an encryption value can be used to select the appropriate modeling, classification, or probability function preventing unauthorized decoding of the stream.

BRIEF DESCRIPTION OF THE DRAWINGS

These and other more detailed and specific objects and features of the present invention are more fully disclosed in the following specification, reference being had to the accompanying drawings, in which:

FIG. 6 is a table with sample values illustrating the process of encoding a symbol stream.

DESCRIPTION OF THE PREFERRED EMBODIMENTS

The present invention is a system and method for compressing and coding signals in a symbol stream. The signals may be encoded using encryption codes preventing unauthorized decoding of the stream. The invention compresses both symbol streams that will be transmitted in real time or data in a discrete data set. Operations are performed on the symbol stream enabling data modeling and classification such that the appropriate coding of the symbols in the symbol stream can be performed. Preferably, the symbol stream presented to the entropy coder is relatively zero centered, which will be the case if an appropriate transform, such as a wavelet transform, is performed on the symbol stream.

Figure 1:
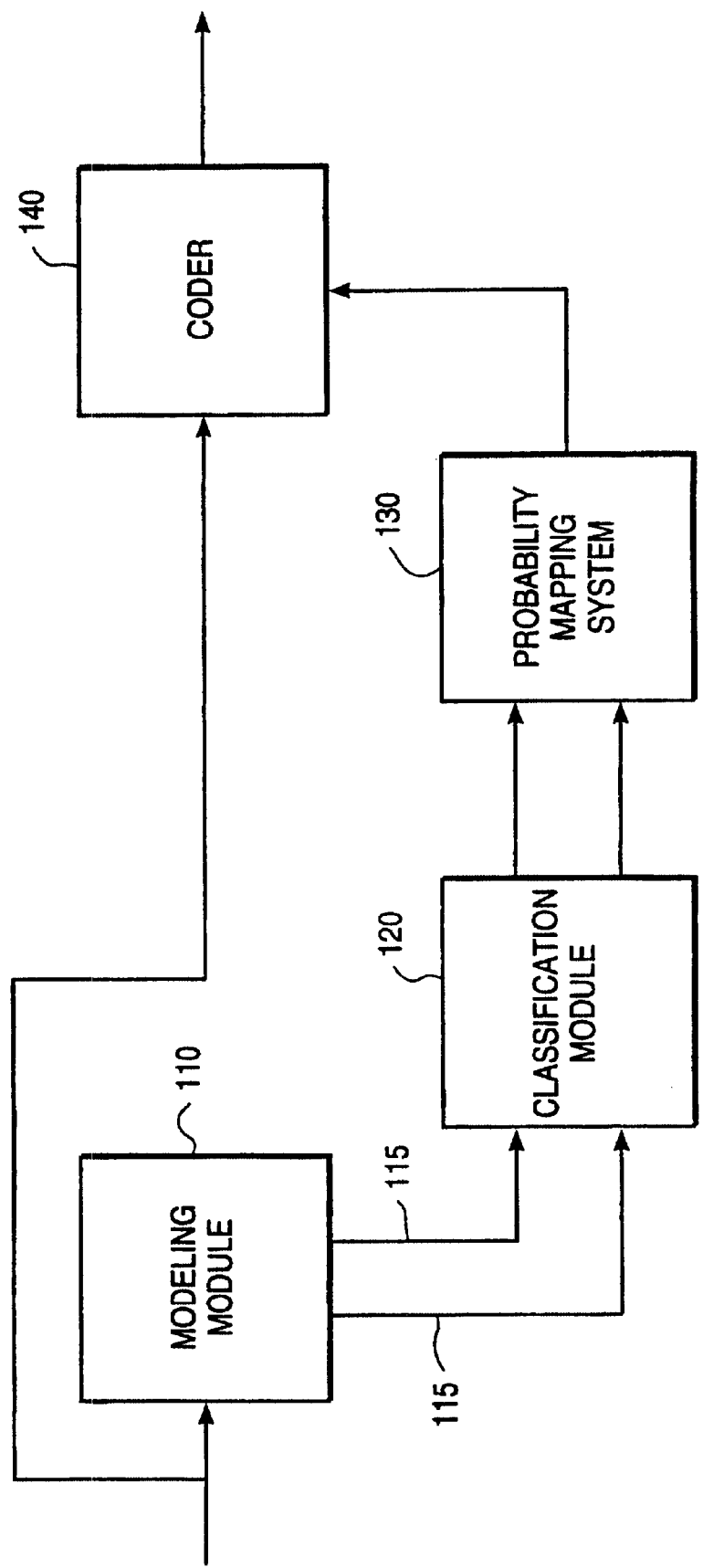
FIG. 1 is a block diagram of the coding system of the present invention.

FIG. 1 is a block diagram of the coding system of the present invention. The system comprises: a modeling module 110, a classification module 120, a probability mapping system 130, and an entropy coder 140. The entropy coder 140 receives a probability function based on the results of operations performed on the symbol stream by the modeling module 110, classification module 120 and probability mapping system 130. The entropy coder 140 may further use encryption algorithms to provide a compressed and encrypted symbol stream.

The modeling module 110 receives the quantified symbol stream. The modeling module 110 uses the quantified symbols to calculate a modeling value, or set of modeling values, that characterizes the stream. In the preferred embodiment, the modeling value is a number that is calculated based on the most recent quantified symbol values. A local estimate of the modeling value is made using a function, B[t], that approximates the local modeling value at a point t in the symbol stream. For example, the modeling value can be determined using a function operating upon a local sample of the symbol stream such as:

$$\text{modeling value} = B[s(t-1), s(t-2)\ldots s(t-n)], \quad \text{(Eq. 1)}$$

where the modeling value at time t is approximated by the function B[s(t)] operating on the last n symbols. A preferred function that can be used by the modeling module 110 to help generate a modeling value and that works well over a very broad range of image types is a short term weighted average of the magnitudes represented by the symbols. The following equation may be used by the modeling module 110 to generate a weighted average:

$$ws = \sum_{1}^{n} \frac{|s(t-n)|}{n} \quad \text{(Eq. 2)}$$

where ws is the weighted sum of the symbol values at time t−1 through t−n and where n is the number of symbols included in the weighted sum. The weighted sum equation gives the greatest weight to the most recent symbol because the last object often serves as the best predictor of the function that approximates the actual probability of the next value in the stream. In one embodiment, the weighted sum is the modeling value 115 passed to the classification module 120. Alternatively, the weighted sum could also be used in a further calculation to generate a modeling value 115. This includes using a particular function to generate the modeling value 115 for some values while using a different function to calculate the modeling value 115 for other values. For example, a logarithm function could be used on the weighted sum if it is more than 1 while a direct mapping between the weighted sum and the modeling value 115 could be used when the sum is less than 1. Furthermore, although the modeling value 115 has been described as a single numeric value, the modeling value 115 could further comprise multiple values that provide information about the objects in the symbol stream. The modeling value 115 could include a deviation value, for instance, indicating the deviation between the values of the quantified symbols. Once the modeling value 115 has been generated, it is passed to the classification module 120.

The classification module 120 receives the modeling value 115 from the modeling module 110. The classification module 120 uses the modeling value 115 to classify, or map, the symbol stream to a probability function. The classification module 120 could generate a probability function based on the modeling value 115, such as using the value as a coefficient in the function, or could simply use the value to map the symbol stream to a probability function. If the value is used to map the symbol stream to a probability function, the probability function may be generated in a continuous fashion using each new modeling value 115 to make adjustments to the probability function. Furthermore, the classification module 120 could map the symbol stream to one of several discrete probability functions.

For example, if the data approximates a bell function, a set of bell functions with varying shapes could be provided. The modeling value 115 could be generated based on the amount by which the quantified symbol values vary from each other and could be used to define the shape of the function. For example, if most of the values are similar, the symbol stream could be mapped to a bell function that is a tall and thin. If there is a lot of variation among the values, the symbol stream could be mapped to a bell function that is a short and wide. In such a case, the modeling value 115 could measure of the variation among symbol values by using a calculated value, such as the standard deviation of the symbol values, in the symbol stream.

The probability function, as well as any parameters that define the shape of the function, are passed to the probability mapping system 130. The probability mapping system 130 uses the probability function to determine the probability of one or more of the symbols in the symbol set. The probability of an object determines how many bits will be used to encode the object in the symbol stream. If the object is one that has a low probability of occurring, more bits will be used to encode the object. On the other hand, if the probability mapping system 130 determines that the object is highly probable, only a few or even less than one bit can be used to transmit the information over the symbol stream. In either case, the probability values generated using the probability function are passed from the probability mapping system 130 to the coder 140.

The coder 140 encodes or decodes the symbols in the symbol stream based on the probabilities provided by the probability mapping system 130. The coder 140 may be any parameterized encoder that can code an input symbol stream based on a probability or probability function. The coder 140 receives the symbol stream and encodes or decodes the symbols in the stream accordingly.

Figure 2:
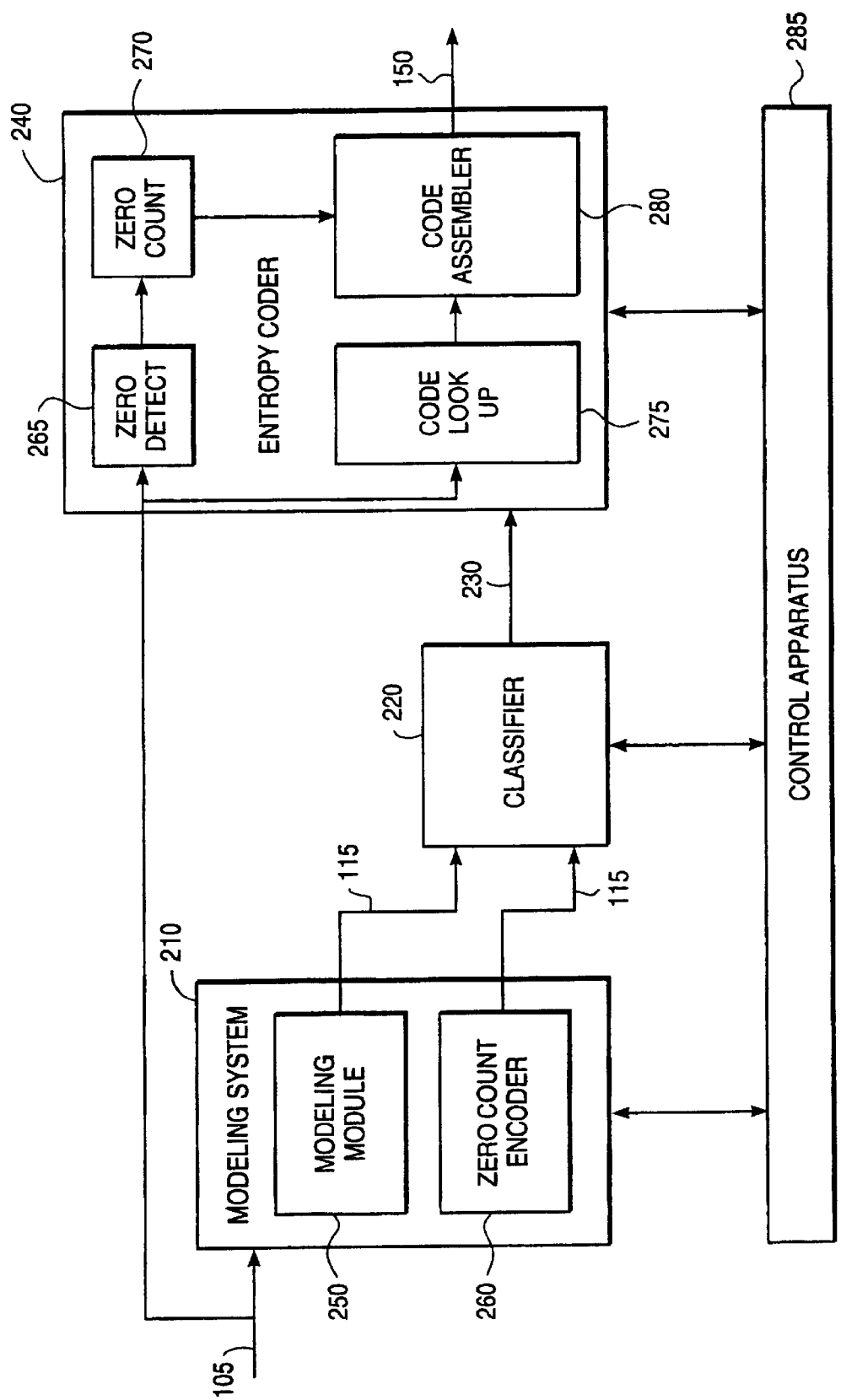
FIG. 2 provides a schematic of an encoding apparatus that encodes a symbol stream according to the present invention.

Referring now to FIG. 2, a schematic of an encoding apparatus that encodes a symbol stream according to the present invention is shown. The encoding apparatus comprises a modeling system 210, a classifier 220, a probability map 230, an entropy encoder 240 and a control apparatus 285. A symbol stream is received by the modeling system 210 and the quantified symbol values are used to generate a weighted sum. The weighted sum is used only as an example of the function that can be used to generate a modeling value 115 and alternate, or additional, functions could be used. In this example, a further calculation using the base 2 logarithm of the weighted sum is used to generate the modeling value 115 passed to the classifier 220.

The modeling system 210 also comprises a zero count encoder 260. The zero count encoder 260 monitors the stream for strings of zeros. When a triggering event occurs, such as the weighted sum calculation equaling zero, the zero count encoder 260 begins tracking the number of zeros. The first zero passed after the triggering event causes the zero count encoder 260 to transmit a modeling value 115 indicating that the zero count encoder 260 will be providing a modeling value 115 as well as the weighted sum function 250. If the next symbol is also a zero, the zero count encoder waits until the next symbol in the stream has been received before transmitting a modeling value 115. If the symbol is not a zero, then the modeling value 115 generated using the logarithm of the weighted sum is again used to encode the stream. If the next value is also zero, however, the zero count encoder 260 transmits a −1 modeling value 115. This modeling value 115 indicates that two zero values have been passed. As the stream of zeros continue, the zero count encoder 260 continues counting increasingly large sets of zeros before transmitting a modeling value 115. For example, after a modeling value 115 of −1 has been transmitted based on a string of 2 zeros in the stream, the zero count encoder 260 will not transmit the next modeling value 115 of −2 until after four zeros have been passed. This process continues with the number of zeros in the set increasing by powers of two before the next modeling value 115 is transmitted. If a non-zero value is in the stream before the next set of zeros is complete, the modeling value 115 calculated according to the weighted sum calculation is used.

The classifier 220 uses the modeling value(s) 115 passed by the modeling system 210 to generate or select a probability function. The classifier 220 performs the functions of the classification module 120 and the probability mapping system 130 as described with reference to FIG. 1. In this embodiment, the classifier 220 retrieves one of the stored probability functions based on the modeling value 115 and transmits the probability map 230 to the code lookup table 275 of the entropy coder. The probability of the current symbol is retrieved from the code lookup table 275 and transmitted to the code assembler 280. The code assembler 280 receives the probability, and other parameters that are used to encode the symbol, and outputs the symbol into the encoded stream 150.

A zero detect circuit 265 is also provided in the entropy coder 240 in order to encode strings of zeros. When the zero count encoder 240 transmits a modeling value 115 to the classifier 220, the entropy coder 240 codes the set of zeros corresponding to that modeling value 115 as a single encoded symbol. The modeling value 115 determines the number of zeros in the set represented by the encoded symbol. For example, a modeling value 115 of −3 indicates that eight zeros ($2^3$) are represented by a single encoded zero in the stream 150. Thus, the zero detect circuit 265 counts and removes the zeros corresponding to the set and passes a single unencoded zero for each complete set to the code assembler to be encoded. A single zero encoded by the code assembler 280 inserted into the stream 150 and represents all of the zeros in set corresponding to the last modeling value 115. Any non-zero values, or zero values that are being coded normally, are ignored by the zero detect circuit 265.

The encoding apparatus further comprises a control apparatus 285. The control apparatus 285 monitors the transmissions between the modeling system 210, the classifier 220, and the encoder 240 to insure that the signals are in the proper time phase. The illustrated encoding apparatus is a single embodiment of the present invention as the particular components included in the system, and the functions used by each of the components, can and will vary between embodiments.

Figure 3:
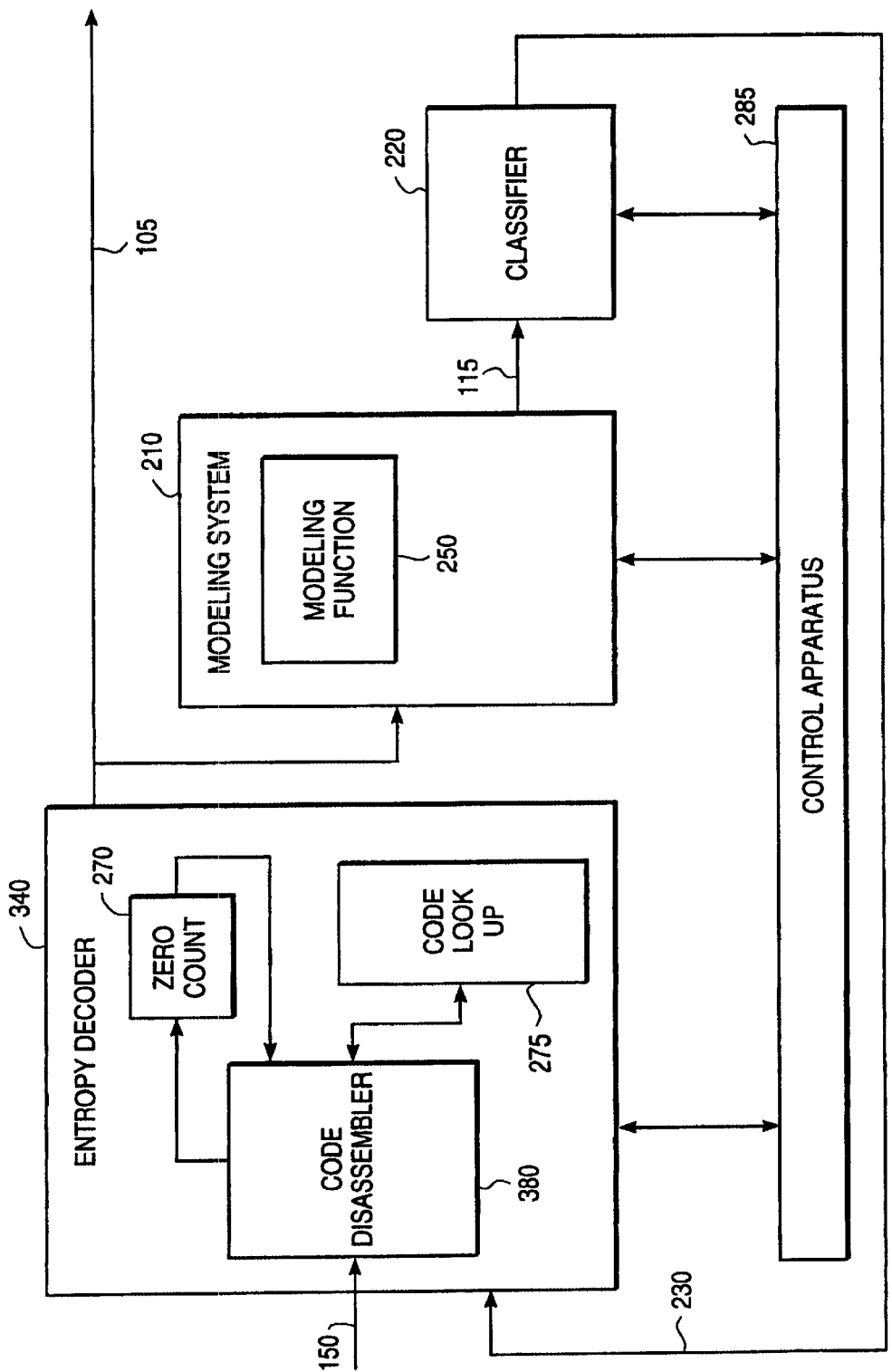
FIG. 3 provides a schematic of a decoding apparatus that decodes a symbol stream according to the present invention.

Referring now to FIG. 3, a schematic of an apparatus that decodes a symbol stream according to the present invention is shown. The decoding apparatus comprises: a modeling system 210, a classifier 220, a probability map 230, and an entropy decoder 340. The encoded stream 150 is initially received by the entropy decoder 340. The decoder 340 retrieves a probability map 230 and uses the characteristics of the encoded symbol to decode the symbol. The encoding process involves assessing the probability of the symbol and encoding it based on that probability. The decoding process performs the process in reverse. The characteristics of the bits used to encode the data enable the decoder 340 to calculate the probability that was used to encode the data. The decoder 340 uses the probability map 230 to match the calculated probability with the original symbol. The original symbol replaces the encoded symbol in the resulting decoded stream 105.

When the stream 150 is initially received by the decoder 300, the classifier 220 and modeling system 210 have not received enough values to generate a probability map 230 that corresponds to the stream 105 being received. In order to decode the first few symbols in the stream 150, a default probability map 230 or function 250 may be used. This insures that the encoder 240 and the decoder 340 are calculating the same probabilities for the same symbols. In many applications, such as streaming video, the symbol stream has a starting frame that can be used to store special symbols that indicate the function to be used. For example, an initializing symbol, such as a zero, could be used to start the stream and, since the decoder knows that the encoded value is a zero, the decoder can use the number of bits used to encode the zero as an indicator of the function being used to generate the probability map 230. The decoding scheme may also provide a converging error value such that, over time, the values decoded using the incorrect probability map will generate a modeling value 115 that generates the appropriate probability map 230.

Furthermore, the selection of the initial probability function may be based on an encryption value. The encryption value may be generated by any encryption means using different variables to calculate the value. For example, the serial number and user name in a software program could be used in a public key encryption system. Public key encryption system provide each person gets two keys—a public key and a private key. The keys allows a person to either encrypt (lock) a message, or to decipher (unlock) an encoded message. Each person's public key is published and the private key is kept secret. Messages are encrypted using the intended recipient's public key and can only be decrypted using the private key, which is generated using variables such as the serial number and user name. As the determination of the probability function used to decode the values is based on the proper decryption of the symbols, this method can be used to prevent unauthorized receipt of the symbol stream. The public key encryption is used as an example of an encryption method but other encryption methods may also be used.

Once an initial probability function has been retrieved and the corresponding probability map 230 is transmitted to the decoder 340, the encoded symbol stream 150 is decoded using the same process as when it was encoded. The quantified values of the decoded symbols are transmitted to the modeling system 210 and a modeling value 115 is generated in the same fashion as the encoding side. The modeling value 115 is then passed to the classifier 220 and the corresponding probability function is used to generate a probability map 230. The characteristics of the bits used to encode the data enable the decoder 340 to calculate the probability that was calculated for the symbol when being encoded. The probability map 230 is received by the decoder and is entered into the code lookup table 275. The code disassembler 340 then uses code look up table 275 to match the calculated probability with the original symbol. The resulting decoded values are transmitted in the decoded symbol stream 105. Additionally, a zero count mechanism 270 is provided in order decode zeros encoded using the zero counting system. When a triggering event occurs in the decoded stream 105, received by the modeling system 210, the values are transmitted to the code disassembler 380. The zero count mechanism 270 provides the code dissembler 380 with a zero count indicating the number of zeros that will be entered in the stream 105.

Figure 4:
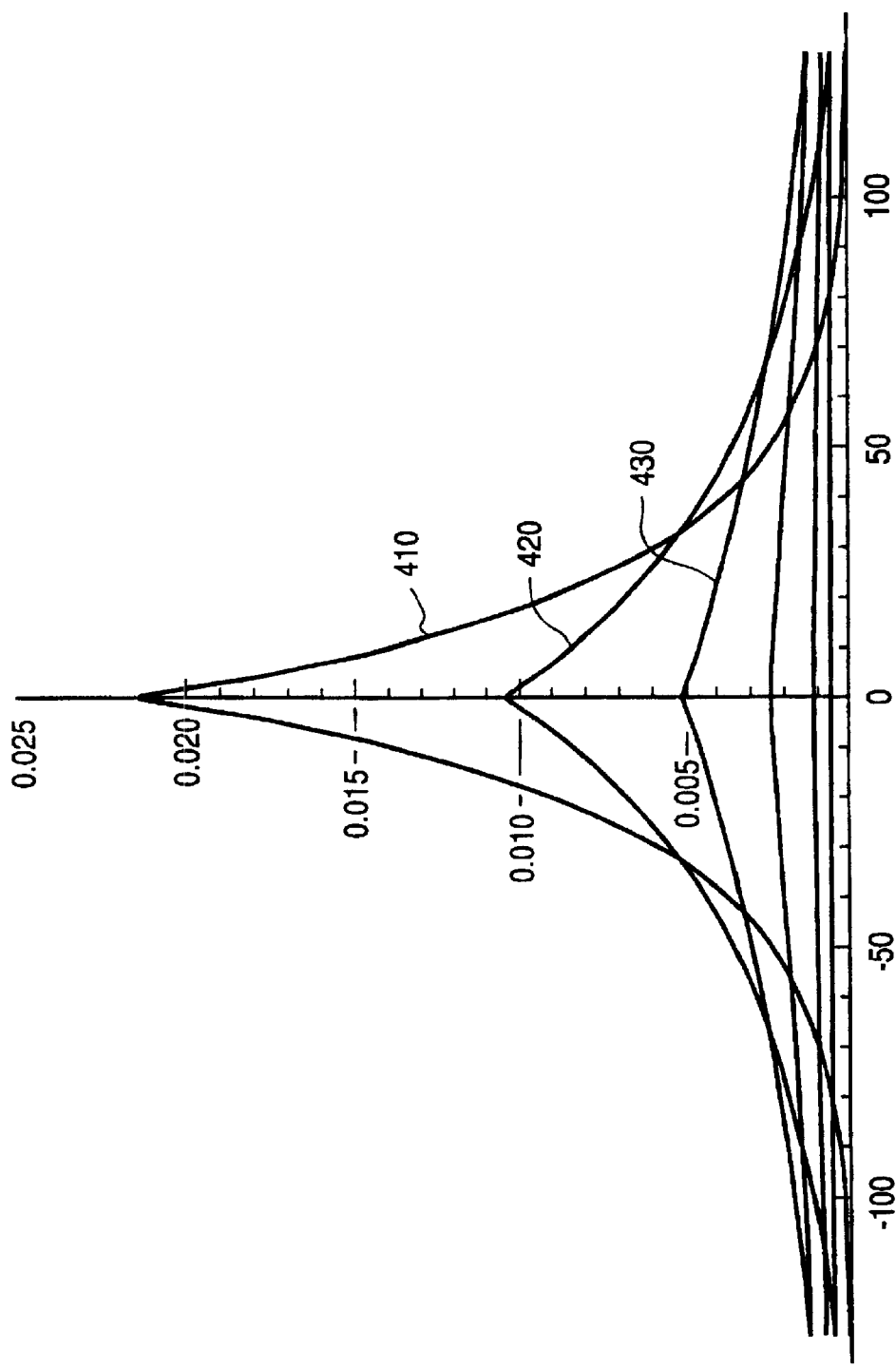
FIG. 4 is a sample set of probability functions used to encode and decode the symbol stream.

Referring now to FIG. 4, a sample set of probability functions is shown. The classification module 120 can generate the functions based on the modeling value 115 received or can store functions that are mapped to particular modeling value 115s. The modeling value 115 characterize the stream enabling identification of the best corresponding function.

As the illustration demonstrates, the functions 410, 420, 430 reflect different probabilities for identical quantified values. If the modeling value 115 maps the symbol stream to the function 420, for example, the probability of getting a zero will be calculated to be about 0.01. If more zeros are received, the modeling value 115 will drop and the new modeling value 115 will map to function 410 that demonstrates an increasingly probability (about 0.02) of a zero symbol being the next symbol in the stream. This results in fewer bits used to encode the zeros in the stream and coding efficiency increases.

Figure 5:
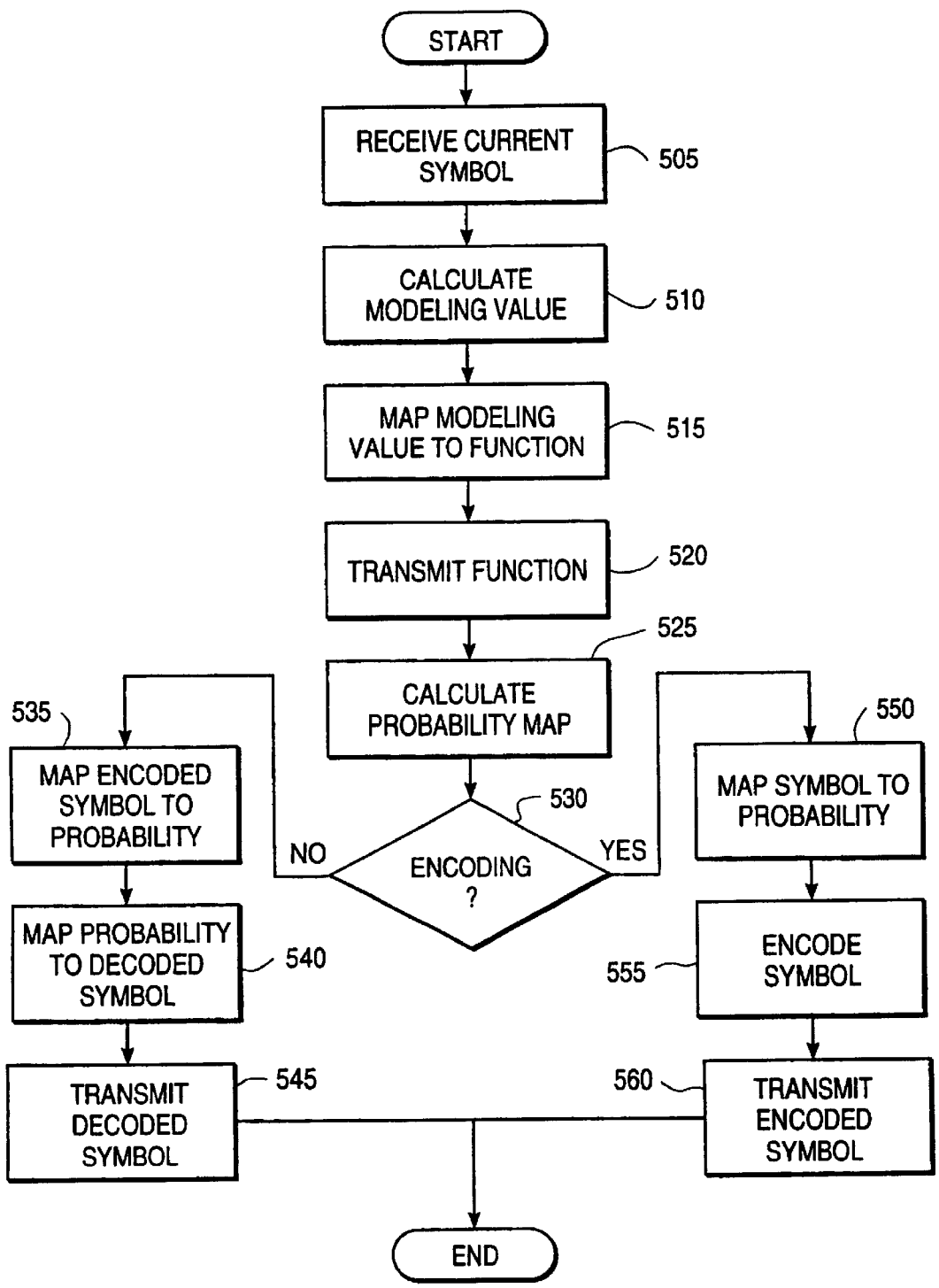
FIG. 5 A flowchart illustrating the method of coding data of the present invention.

A flowchart illustrating the method of coding data of the present invention is shown in FIG. 5. The method begins when a symbol stream is received by the modeling module 110. The modeling module 110 receives 505 a current symbol. The modeling module 110 uses the quantified values to calculate 510 a modeling value 115. A function, such as a weighted average function, is used to calculate the modeling value 115. The type of function used, and the parameters of the function used, may vary depending on the characteristics of data that is being encoded. For instance, if the function calculates a weighted average, the parameter controlling the number of elements used to calculate the weighted average may vary based on the symbol stream. A weighted average may be calculated by using more values when a symbol stream has occasional spikes and may use less values for calculating the weighted averaged for a stream that tends to be stable. If a weighted average is used, the calculated modeling value 115 is a single numeric value but other functions may generate one or more values that model the symbol stream. The weighted average could further be used in a second function to calculate the modeling value 115.

In the preferred embodiment, a modeling value 115 is calculated 510 by taking the base two logarithm of a weighted average of the quantified symbols and rounding the logarithm value to the nearest integer. The calculated modeling value 115 is transmitted to the classification module 120. Other functions, however, could also be used to calculate the modeling value 115 based on particular characteristic of the stream. This is particularly true when a modeling function cannot be used over certain ranges of values. For example, a logarithm function provides no information when the weighted average is equal to zero. Under these conditions, the modeling module 110 can provide an additional modeling function to generate another modeling value 115. For example, a second modeling value 115 is calculated using the number of zeros in the stream as a revised modeling value 115. If the weighted average is equal to zero and the next symbol is also a zero, the modeling module 110 can pass a modeling value 115 of zero to the classification module 120. The modeling value 115 generated using the alternate function can be used as long as the weighted sum is zero. This enables greater flexibility in compression as particular portions of the symbol stream may vary in ways that can be anticipated with an improved modeling value 115 function. Further details of the process of moving between modeling functions is described with reference to the table in FIG. 6.

The classification module 120 maps 515 the model value to a probability function. The probability function could be generated using the model value, such as using the model value as the base of a power function, or may be used to select a probability function from a set of functions stored in the classification module 120. For instance, the classification module 120 could store a selection of sixteen functions that reflect different types of symbol streams and the modeling value 115 could be used to select among these sixteen probability functions. Alternatively, the function could be a function that is continuously adjusted as the modeling value 115 changes. The selected probability function or function is transmitted 520 to the probability mapping system 130.

The probability mapping system 130 receives the probability function. If the stream is being encoded 530, the probability mapping system 130 calculates 525 a probability map 230 that includes the probability that current symbol would have been the next symbol in the stream. The probabilities are provided to the code lookup table 275 that stores the probabilities for retrieval by the code assembler 280. The probability of the current symbol determines the number of bits that will be used to encode the symbol. The symbol is mapped 550 to the appropriate probability. The symbol will be encoded 555 with only a few bits if the probability of the current symbol being the next symbol in the stream is highly likely relative to the probability of the other symbols in the symbols set. More bits will be used to encode the symbol as the relative probability of the current symbol decreases. The decoded symbol is then transmitted 560 in the encoded symbol stream 150.

If the stream is being decoded 530, the probability map is passed to the code lookup table 275 that provides a means for mapping 535 the number of bits in the encoded symbol with the probability used by the coder to encode the symbol. For example, if only a single bit was used to encode the symbol, the probability calculated on the encoding end was quite high. The characteristics of the bit, such as whether a 1 or 0 were used for example, is also used to refine that probability. If a single zero were used, for instance, then the symbol is matched to the highest probability in the probability function.

The decoder then maps 540 the probability with the appropriate quantified symbol that replaces the encoded symbol in the decoded symbol stream. On the encoding end, each symbol is assigned a probability based on the modeling value 115 and corresponding probability function. This process is now reversed. For example, if the number "N" was the symbol that, according to the probability function, was most likely to be the next symbol in the stream, the coder would decode a symbol with the least number of bits as "N". This process is repeated and new modeling value 115, and the corresponding probability function, is used to decode each symbol dynamically. The decoded symbol is then transmitted into the stream 545.

The following description provides an example a symbol stream being coded according to the present method. For illustration purposes, the probability of getting a zero as the next symbol in the symbol stream, as provided by the probability function matching the modeling value 115 and other relevant factors, has been provided in a table in FIG. 6. In this example embodiment, the modeling module 110 determines the modeling value 115 by calculating an adjusted logarithm base two of the weighted average of the last four symbols in the stream. The calculated value is rounded to the nearest integer and this modeling value 115 is passed to the classification module 120. Additionally, in this example, the classification module 120 stores a selection of probability functions that are mapped to each of the modeling value 115. Finally, a symbol set size of 4096 is used and 24 functions will be stored in the classification module 120. The use of these parameters in this example is meant to demonstrate the practical application of the invention to data transmission and is not meant to restrict the scope of the claims. Any number of different modeling value 115 calculations, probability functions, and symbol sets can be used to effectively implement the invention.

Suppose that the last four symbols in the stream prior to the current symbol provided high symbol values resulting in a weighted average of 768. The adjusted base 2 logarithm of the weighted average equals 10 and this modeling value 115 is passed to the classification module 120. The probability function corresponding to a modeling value 115 equal to 10 is retrieved by the classification module 120 and passed to the probability mapping system 130. The probabilities provided by the probability mapping system 130 is used by the encoder to encode the symbol. Suppose further that the current symbol being transmitted is a zero. With reference to the table, the probability that the first symbol will equal zero is calculated to be 1 in 1535. Since the zero was extremely unexpected, the zero would be encoded with approximately twelve bits. These twelve bits would be provided in the coded value stream 150 by the entropy coder 240.

Now suppose that the next symbol (the second symbol) also equals zero. This results in a reduction of the modeling value 115, possibly to nine, depending on the values of the symbols prior to the first symbol. The probability distribution corresponding to a modeling value 115 equal to nine would then be used to encode the second symbol. The second symbol would be encoded just as the first symbol and provided in the stream of coded values 150 by the coder 240. In this case, however, the symbol would require only 11 bits to encode since the probability distribution indicated a greater likelihood of zero. As low values (such as zeroes) are encountered, the classification module 120 passes probability functions that indicate a greater likelihood of such values and encoding efficiency increases. Additionally, particularly where, as here, a weighted sum using a limited number of values such as four is used, the appropriate probability distribution will rapidly transition to one appropriate to the stream. This method is enhanced by the provision of an alternate function that calculates a modeling value 115 according to the zero count. For example, if four consecutive zeroes are encountered, then for the fifth symbol the function corresponding to the modeling value 115 of zero could be used. The following example illustrates the transition between two functions that are used to calculate the modeling value 115 for different types of streams. For illustration purposes, it will be assumed that when the stream has an average value of zero, the alternate function will be implemented.

Continuing with the same parameters as used in the previous example, suppose that after the function corresponding to a modeling value 115 of 10 was used because of prior high value history, the next four symbols were zero (symbols one through four). The symbols would have been encoded according to the probability functions mapped to the calculated modeling value 115 and would be provided in the stream of coded values 150 produced by the entropy coder 240. For the fifth symbol, the weighted sum would equal zero so the probability distribution where the modeling value 115 equals 0 is used.

When the modeling value 115 is zero, however, an alternate function is used to provide an additional modeling value 115. In this case, the zero counting method is preferably implemented. If the fifth symbol does not equal zero, it is encoded using the distribution corresponding to the previous modeling value 115 using the standard encoding process as described above. Suppose, however, that the fifth symbol does equal zero. This zero would not be immediately used to generate a new modeling value 115. As explained above, the probability function used to encode the symbol will depend on subsequent symbol values. Suppose that the sixth symbol also equals zero. Because two consecutive zeroes would have been encountered, a new modeling value 115 of −1 is calculated. When the modeling value 115 is −1, a zero inserted by the encoder into the coded value stream 150 is the equivalent of two ($2^1$) zeros. Thus, a single coded zero would actually represent the two zeroes corresponding to the fifth and sixth symbols.

If four more zeroes (for symbols 7–10) were passed in the stream 105, a modeling value 115 at of −2 would be calculated and the four zeros set would be represented by a single zero in the coded value stream. Thus, the coder 240 would insert "00" into the coded stream 150 for the actual values "000000" for symbols 5–10. Eight more zeros (for symbols 11–18) must be passed in the stream 105 to complete the zero set corresponding to a modeling value 115 of −3. At this point, eight consecutive zeroes would be stored as a 0. Thus, "000" could be the coded value stream for the actual values "00000000000000" of symbols 5–18. This process continues by doubling the number of zeros required in a set before the next modeling value 115 is calculated.

Suppose, however, that after an initial state having a modeling value 115 equal to 10, only symbols 1–14 were zero, and that symbol 15 was non-zero. The coded value stream 150 would include appropriate coding for the zeroes of symbols 1–4, and "00" for symbols 5–10. A third consecutive zero, which would have corresponded to eight 0s (11–18) would not be included in the stream 150 of coded values. Rather, once non-zero value 15 would be encountered, it would be encoded using the conventional coding scheme (according to the b equals minus three function) and would be inserted into the coded value stream 150. Additionally, the four zeroes for symbols 11–14 would be represented by a codeword indicating that the next set of zeroes would also be inserted directly the stream 150 of coded values.

Assume that the designation (ECn) is the coded value for the nth symbol (e.g., for the first symbol, as described above, $EC_1$ would be 11 bits of information). A resulting exemplary stream 150 of coded values would sequentially be ($EC_1$), ($EC_2$), ($EC_3$), ($EC_4$), 0, 0, ($EC_{15}$), (codeword). Alternatively, the (codeword) could precede (V15) in the stream of coded values. The progression of zeroes in this example would be compactly provided in the coded value stream 150. For example, "00000" in a coded value stream 150 would represent 44 zeroes from the original symbol stream 105. Indeed, when the modeling value 115 is equal to minus 12, a single zero in the coded value stream 150 would represent 4096 ($2^{12}$) zeroes in the original symbol stream 105. 4096 is just an exemplary limit and the invention can be implemented with higher consecutive zero representations. Additionally, zero is used to demonstrate the method and other non-zero centered schemes could be implemented. Furthermore, although powers of two are implemented in the preferred embodiment, the method does not have to be base two driven.

I claim:

1. A method for encoding symbols in a symbol stream to compress the amount of data required to represent a signal corresponding to the symbol stream, the method comprising:
   obtaining a current symbol in the symbol stream; and
   encoding the current symbol, such encoding being the result of:
      using a modeling function to determine, for symbol values local to the current symbol, a modeling value based upon the magnitudes of such local symbol values; and
      using the modeling value to determine a continuous probability function that associates a probability value with each of the symbols in the stream; and
      using the probability function in encoding the current symbol.

2. The method of claim 1, wherein using the modeling value to determine the continuous probability function includes using the modeling value as an address for locating the continuous probability function in a defined set of functions.

3. The method of claim 1, wherein using the modeling value to determine the continuous probability function includes using the modeling value as a variable in a continuous probability function.

4. The method of claim 1, wherein using the modeling value to determine the continuous probability function includes an encryption value.

5. The method of claim 4, wherein the encryption value is a public key in a public key encryption system.

6. A method for decoding symbols in a symbol stream comprising:
   obtaining a current encoded symbol in a stream of encoded values; and
   decoding the current encoded symbol, such decoding being the result of:
      using a modeling function to determine, for symbol values local to the current encoded symbol, a modeling value based upon the magnitudes of such local symbol values; and
      using the modeling value to determine a continuous probability function that associates a probability value with each of the symbols in the stream; and
      using the continuous probability function in decoding the current encoded symbol.

7. The method of claim 6, wherein the method further comprises, responsive to receiving a first symbol in the symbol stream:
   generating an initial probability function for decoding the symbols in the stream; and
   decoding the symbols in the stream using the initial probability function until a modeling value is calculated.

8. The method of claim 7, wherein generating an initial probability function includes using an encryption value to decode an initial modeling value.

9. The method of claim 6, wherein using the modeling value to determine the continuous probability function includes using the modeling value as an address for locating the continuous probability function in a defined set of functions.

10. The method of claim 6, wherein using the modeling value to determine the continuous probability function includes using the modeling value as a variable in a continuous probability function.

11. The method of claim 6, wherein the method further comprises replacing the current encoded symbol with more than one symbol.

12. A system for encoding symbols in a symbol stream comprising:
   a modeling module for determining, for symbol values local to a current symbol in the symbol stream, a modeling value based upon the magnitudes of such local symbol values;
   coupled to the modeling module, a classification module for using the modeling value to determine a continuous probability function that associates a probability value with each of the symbols in the symbol stream;
   coupled to the modeling module, a probability mapping system for determining the probability of the current symbol in the symbol stream; and
   coupled to the probability mapping system, an entropy coder for encoding the current symbol based on the probability of the current symbol.

13. The system of claim 12, wherein the classification module further comprises a table containing continuous probability functions.

14. The system of claim 12, wherein the modeling module further comprises a symbol counter for counting the number of consecutive identical symbols and generating a modeling value based on the count.

15. A system for decoding symbols in a symbol stream comprising:
   a modeling module for determining, for symbol values local to a current encoded symbol, a modeling value based upon the magnitudes of such local symbol values;
   coupled to the modeling module, a classification module for using the modeling value to determine a continuous probability function that associates a probability value with each of the symbols in the symbol stream;
   coupled to the modeling module, a probability mapping system for determining the probability of the current encoded symbol; and
   coupled to the probability mapping system, an entropy coder for decoding the current encoded symbol based on the probability of the current encoded symbol.

16. The system of claim 15, wherein the classification module further comprises a table containing continuous probability functions.

17. A computer-readable medium containing a computer program that:

obtains a current symbol in a symbol stream; and encodes the current symbol, such encoding being the result of:

using a modeling function to determine, for symbol values local to the current symbol, a modeling value based upon the magnitudes of such local symbol values; and using the modeling value to determine a continuous probability function that associates a probability value with each of the symbols in the stream; and using the probability function in encoding the current symbol.

* * * * *